United States Patent
Kamiya et al.

(10) Patent No.: US 10,447,259 B2
(45) Date of Patent: Oct. 15, 2019

(54) ELECTRONIC CIRCUIT PROVIDED WITH PLURALITY OF SWITCHING ELEMENTS CONNECTED TO BUS BAR

(71) Applicant: DENSO CORPORATION, Kariya, Aichi-pref. (JP)

(72) Inventors: Akira Kamiya, Kariya (JP); Yohei Kondo, Kariya (JP); Yosuke Asako, Kariya (JP)

(73) Assignee: DENSO CORPORATION, Kariya (JP)

( * ) Notice: Subject to any disclaimer, the term of this patent is extended or adjusted under 35 U.S.C. 154(b) by 100 days.

(21) Appl. No.: 15/496,291

(22) Filed: Apr. 25, 2017

(65) Prior Publication Data
US 2017/0310318 A1    Oct. 26, 2017

(30) Foreign Application Priority Data

Apr. 26, 2016 (JP) .................. 2016-088415

(51) Int. Cl.
*F16P 3/20* (2006.01)
*H03K 17/12* (2006.01)
(Continued)

(52) U.S. Cl.
CPC .......... *H03K 17/127* (2013.01); *H02M 7/537* (2013.01); *H02M 7/53875* (2013.01); *H02P 27/06* (2013.01); *H03K 17/08142* (2013.01); *H03K 17/122* (2013.01); *H03K 17/167* (2013.01); *B60L 2210/40* (2013.01);
(Continued)

(58) Field of Classification Search
CPC .. B60L 11/08; B60L 2210/40; B60L 2220/14; H02M 7/537; H02M 2001/0054; H02M 7/53875; H02P 27/06; H03K 17/122; H03K 17/127; H03K 17/08142; H03K 17/167

See application file for complete search history.

(56) References Cited

U.S. PATENT DOCUMENTS 6,226,192 B1 *  5/2001  Yamanaka .............. H02M 1/34
                                                           363/56.01
2012/0206077 A1 *  8/2012  Yoneshima ............. H02P 6/185
                                                           318/400.33
(Continued)

FOREIGN PATENT DOCUMENTS

JP   2000-197206 A   7/2000
JP   2002-078104 A   3/2002

*Primary Examiner* — Alfonso Perez Borroto
*Assistant Examiner* — Esayas G Yeshaw
(74) *Attorney, Agent, or Firm* — Oliff PLC

(57) ABSTRACT

An electronic circuit includes: a bus bar connected to a power source having a positive terminal and a negative terminal; and a plurality of object switching elements as driving objects connected to the bus bar, the object switching elements forming a parallel connected circuit. The object switching elements include minimum on-resistance elements having minimum on-resistance compared to other object switching elements in a corresponding current region among mutually different current regions; and connection points between the minimum on-resistance elements and the bus bar are located at different locations to have mutually different inductance of respective conduction paths between the power source to the connection points located at the different locations.

9 Claims, 5 Drawing Sheets

(51) Int. Cl.
  *H02M 7/537* (2006.01)
  *H02P 27/06* (2006.01)
  *H02M 7/5387* (2007.01)
  *H03K 17/0814* (2006.01)
  *H03K 17/16* (2006.01)
  *H02M 1/00* (2006.01)

(52) U.S. Cl.
  CPC .. *B60L 2220/14* (2013.01); *H02M 2001/0054* (2013.01); *Y02B 70/1491* (2013.01); *Y02T 10/642* (2013.01); *Y02T 10/7241* (2013.01)

(56) References Cited

U.S. PATENT DOCUMENTS

| | | | | |
|---|---|---|---|---|
| 2012/0217849 | A1* | 8/2012 | Aoki | H02P 6/18 310/68 D |
| 2013/0343105 | A1* | 12/2013 | Kosugi | H02M 1/32 363/56.01 |
| 2014/0139150 | A1* | 5/2014 | Morisaki | B60L 15/20 318/139 |

* cited by examiner

ELECTRONIC CIRCUIT PROVIDED WITH PLURALITY OF SWITCHING ELEMENTS CONNECTED TO BUS BAR

CROSS-REFERENCE TO RELATED APPLICATION

This application is based on and claims the benefit of priority from earlier Japanese Patent Application No. 2016-88415 filed Apr. 26, 2016, the description of which is incorporated herein by reference.

BACKGROUND

Technical Field

The present disclosure relates to an electronic circuit provided with a plurality of switching elements connected in parallel to each other.

Description of Related Art

The electronic circuit includes, as disclosed by JP-A-2000-197206, a drive circuit that drives a parallel connected circuit in which an IGBT as a Si (silicon) device and a MOSFET as a SiC (silicon carbide) device are connected in parallel. According to this configuration, maximum current value can be increased in a large current region, and large amount of current can flow through a MOSFET having low on-resistance in a small current region so that power loss in the small current region can be reduced.

Switching elements such as IGBTs or MOSFETs are connected to a power source via a bus bar through which current flows between the switching elements and the power source. Depending on positions of the connection points on the bus bar connected to the switching elements, inductance values of electrical connection are different between respective connection points to the power source. Hence, the inductance variation may influence a driving operation of the switching element.

SUMMARY

The present disclosure provides an electronic circuit capable of avoiding an adverse effect to the switching elements.

Hereinafter, detailed configuration of the electronic circuit and advantageous effects will be described.

The present disclosure provides an electronic circuit including: a bus bar connected to a power source having a positive terminal and a negative terminal; and a plurality of object switching elements as driving objects connected to the bus bar, the object switching elements forming a parallel connected circuit. The object switching elements include minimum on-resistance elements having minimum on-resistance compared to other object switching elements in a corresponding current region among mutually different current regions; and connection points between the minimum on-resistance elements and the bus bar are located at different locations to have mutually different inductances of respective conduction paths between the power source to the connection points located at the different locations.

According to the above-described disclosure, the object switching elements include minimum on-resistance elements having minimum on-resistance compared to other object switching elements in a corresponding current region among mutually different current regions. Hence, in the respective current regions, a large amount of current flows through the minimum on-resistance elements rather than other switching elements. On the other hand, depending on the inductance value of the electrical conduction path from the connection points of the object switching elements to the power source on the bus bar, an amount of surge voltage caused by switching of the object switching elements and an amount of current flowing into the object switching elements are different.

According to the above-described disclosure, in respective current regions, the connection points of the minimum on-resistance elements on the bus bar are disposed at locations to have different inductances of conduction paths from the power source on the bus bar. Hence, in the object switching elements, the connection of the object switching element having a large amount of current flowing can be designed to have an appropriate inductance value for a large current flow. Thus, adverse effects can be avoided for driving the object switching elements.

As an embodiment of the above-described disclosure, the following configuration can be employed, that is, the minimum on-resistance elements in the object switching elements, where an on-resistance becomes minimum in a predetermined current region, are located on the bus bar at a location having smaller inductance to the power source than that of other minimum on-resistance elements in the object switching elements, where an on-resistance becomes minimum in a current region smaller than the predetermined current region.

The larger the current flowing through the parallel connected circuits which are connected to the power source via the bus bar, the larger the current flowing through the minimum on-resistance elements in the large current region. Here, the larger the current flowing through the object switching elements, the larger the surge voltage due to switching operations of the object switching elements. Hence, in the plurality of object switching elements, surge voltage becomes larger at the minimum on-resistance elements in the large current region than other switching elements.

The smaller the inductance of the electrical conduction path to the power source from the object switching element via the bus bar, the smaller the surge voltage due to the switching of drive state of the switching elements. In other words, the smaller the inductance of the conduction path, the more reduces the surge voltage. In this respect, the following configuration can be used, that is, the minimum on-resistance elements in the object switching elements, where an on-resistance becomes minimum in a predetermined current region, are located on the bus bar at a location having smaller inductance to the power source than that of other minimum on-resistance elements in the object switching elements, where an on-resistance becomes minimum in a current region smaller than the predetermined current region. Thus, in the large current region where large amount of current flows through the above-described parallel connected circuits, the surge voltage can be reduced so that electronic circuits can be prevented from being damaged.

As an embodiment of the above-described disclosure, the following configuration can be used, that is, the minimum on-resistance elements in the object switching elements (SUHB, SVHB, SWHB) where an on-resistance becomes minimum in a predetermined current region, are located on the bus bar at a location having smaller inductance to the power source than that of other minimum on-resistance elements in the object switching elements (SUHA, SVHA, SWHA) where an on-resistance becomes minimum in a current region larger than the predetermined current region.

The larger the current flowing between the above-described parallel connected circuits and the power source via the bus bar, the larger the current flowing through the minimum on-resistance switching elements in the small current region.

As described, the smaller the inductance of the electrical conduction path between the object switching element and the power source via the bus bar, the larger the current flowing to the switching element or more enhances an effect of reducing the surge voltage which is caused by switching operation of the elements. In this regard, the following configuration is used, that is, the minimum on-resistance elements in the object switching elements where an on-resistance becomes minimum in a predetermined current region, are located on the bus bar at a location having smaller inductance to the power source than that of other minimum on-resistance elements in the object switching elements where an on-resistance becomes minimum in a current region larger than the predetermined current region. Thus, in a current region where a small amount of current flows through the parallel connected circuits, current preferentially flows through the object switching elements having smallest on-resistance (i.e., minimum on-resistance elements) in a small current region. Also, surge voltage due to switching operation of the minimum on-resistance elements can be reduced. As a result, power loss of the electronic circuits can be reduced.

DETAILED DESCRIPTION OF THE PREFERRED EMBODIMENTS (First Embodiment)

Hereinafter, with reference to the drawings, a first embodiment of an on-vehicle inverter of an electronic circuit according to the present disclosure will be described.

Figure 1:
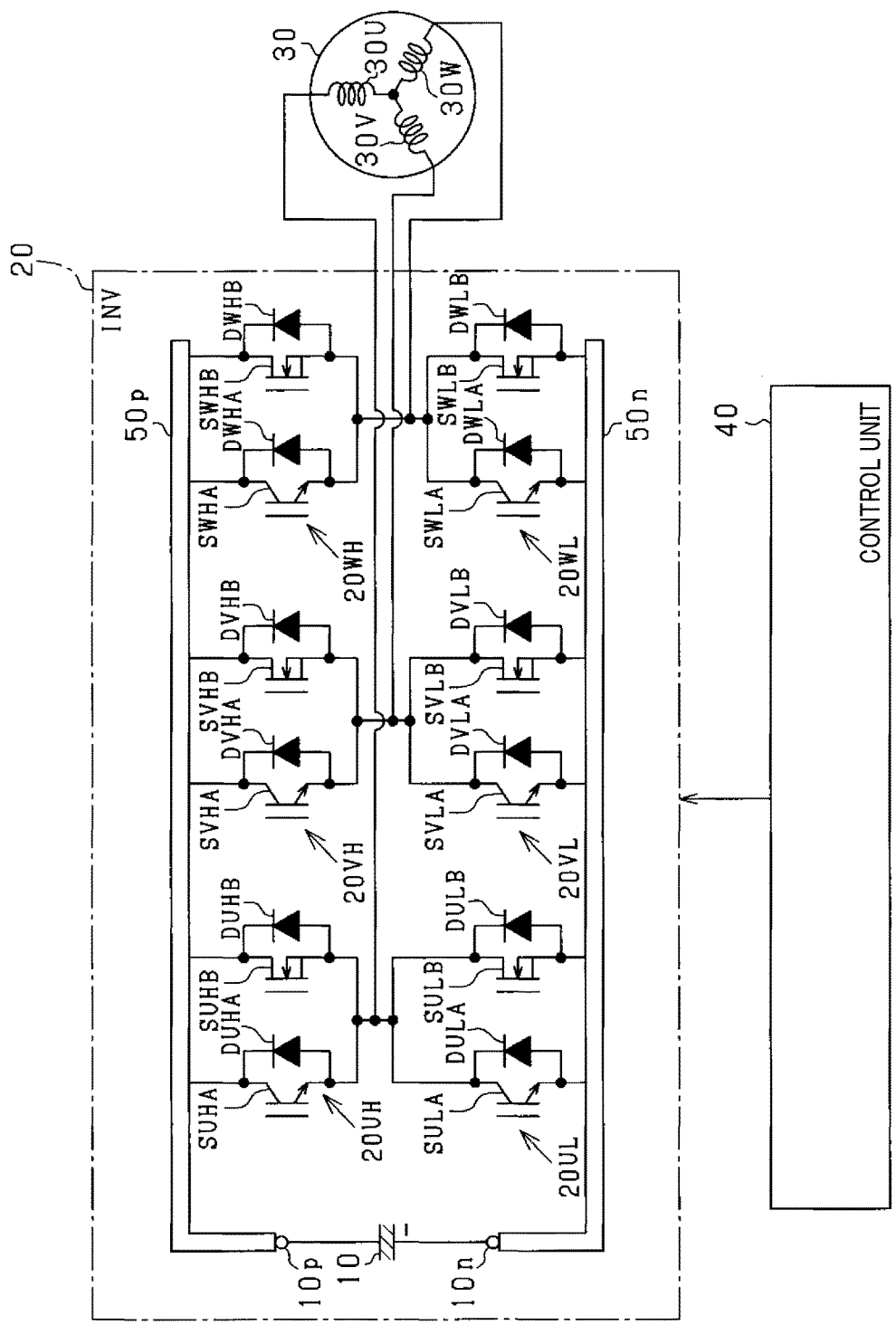
FIG. 1 is a diagram showing an overall configuration of an on-vehicle motor control system according a first embodiment.

As shown in FIG. 1, a control system is provided with a smoothing capacitor 1, an inverter 20, a motor generator 30 and a control unit 40. Also, in FIG. 1, bus bars 50p (positive side) and 50n (negative side) are shown, in which a positional relationship among respective switches (described later) and a positional relationship between bus bars and the switches are illustrated.

The motor generator 30 serves as an on-vehicle main equipment, capable of transmitting motive power to the driving wheel (not shown). According to the present embodiment, three-phase motor-generator is used as the motor generator 30. As the motor generator, a permanent-magnet type synchronous motor can be used.

The inverter 20 has switching portions. Specifically, the inverter 20 is provided with a series-connected body of a U-phase upper arm switch 20UH and a U-phase lower arm switch 20UL. The U-phase upper arm switch 20UH includes a U-phase first upper arm switching element SUHA and a U-phase second upper arm switching element SUHB. The U-phase lower arm switch 20UL includes a U-phase first lower arm switching element SULA and a U-phase second lower arm switching element SULB. At the output terminals corresponding to the U-phase first upper arm switching element SUHA and the U-phase second upper arm switching element SUHB, respective input terminals corresponding to the U-phase first lower arm switching element SULA and the U-phase second lower arm switching element SULB are connected.

The inverter 20 is provided with a series-connected body of a V-phase upper arm switch 20VH and a V-phase lower arm switch 20VL. The V-phase upper arm switch 20VH includes a V-phase first upper arm switching element SVHA and a V-phase second upper arm switching element SVHB. The V-phase lower arm switch 20VL includes a V-phase first lower arm switching element SVLA and a V-phase second lower arm switching element SVLB.

The inverter 20 is provided with a series-connected body of a W-phase upper arm switch 20WH and a W-phase lower arm switch 20WL. The W-phase upper arm switch 20WH includes a W-phase first upper arm switching element SWHA and a W-phase second upper arm switching element SWHB. The W-phase lower arm switch 20WL includes a W-phase first lower arm switching element SWLA and a W-phase second lower arm switching element SWLB.

According to the first embodiment, an IGBT as a Si (silicon) device is used for the first switching elements SUHA, SULA, SVHA, SVLA, SWHA, and SWLA. Hence, the output terminal of each first switching element is an emitter, and the input terminal thereof is a collector. According to the first embodiment, for each of the second switching elements SUHB, SULB, SVHB, SVLB, SWHB and SWLB, an N-channel MOSFET is used as a Sic device. Accordingly, in the second switching elements, each of the output terminals serves as source, and each of the input terminals serves as a drain.

For the first switching elements SUHA, SULA, SVHA, SVLA, SWHA and SWLA, free-wheel diodes DUHA, DULA, DVHA, DVLA, DWHA, DWLA are connected respectively in reverse direction of the switching elements. These free-wheel diodes are connected in parallel to each other. In the second switching elements SUHB, SULB, SVHB, SVLB, SWHB and SWLB, body diodes DUHB, DULB, DVHB, DVLB, DWHB and DWLB are formed respectively.

It should be noted that free-wheel diodes may be connected to respective second switching elements in the reverse direction, and the free-wheel diodes are connected in parallel between the second switching elements.

Figure 2:
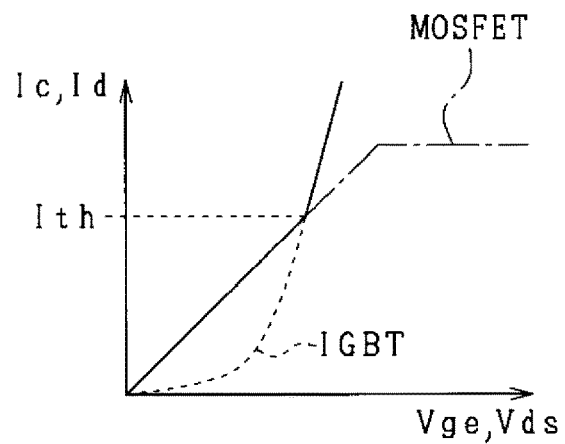
FIG. 2 is a diagram showing voltage-current characteristics for an IGBT and a MOSFET.

According to the second embodiment, respective switching parts are configured of a parallel connected circuit including an IGBT and a MOSFET. This is because, current flows, in the small current region, through the MOSFET which has low on-resistance, thereby reducing power loss in the small current region. With reference to FIG. 2, the configuration of the first embodiment will be described. In FIG. 2, a dashed line represents voltage-current characteristics between the source-drain voltage Vds and the drain current Id of the MOSFET, and a dotted line represents voltage-current characteristics between the collector-emitter voltage Vce and the collector current Ic of the IGBT. Also, a solid line represents the voltage-current characteristics when the IGBT and MOSFET are connected in parallel.

As shown in FIG. 2, in the small current region where an amount of current is less than a predetermined current Ith, the drain-source voltage Vds to the drain current id is lower than the collector-emitter voltage Vce to the collector current Ic. In other words, the on-resistance of the MOSFET is smaller than the on-resistance of the IGBT in the small current region. Hence, in the small current region, a larger amount of current flows at the MOSFET than that flowing through the IGBT when the MOSFET and IGBT are connected in parallel to each other. On the other hand, in the large current region where an amount of current is more than the predetermined current Ith, the collector-emitter voltage Vce to the collector current Ic is lower than the drain-source voltage Vds to the drain current Id. That is, in the large current region, the on-resistance of the IGBT is smaller than the on-resistance of the MOSFET. Hence, in the large current region, larger amount of current flows through the IGBT than through the MOSFET, when the MOSFET and IGBT are connected in parallel to each other.

According to the first embodiment, the maximum value of the collector current Ic capable of flowing through the first switching elements SUHA, SULA, SVHA, SVLA, SWHA and SWLA is set to be larger than the drain current Id capable of flowing through the second switching elements SUHB, SULB, SVHB, SVLB, SWHB and SWLB.

Referring back to FIG. 1, a first end of the U-phase winding 30U of the motor generator 30 is connected to the connection point between the U-phase upper arm switch 20UH and U-phase lower arm switch 20UL. Similarly, a first end of the V-phase winding 30V of the motor generator 30 is connected to the connection point between the V-phase upper arm switch 20VH and V-phase lower arm switch 20VL. Moreover, a first end of the W-phase winding 30W of the motor generator 30 is connected to the connection point between the W-phase upper arm switch 20WH and W-phase lower arm switch 20WL. The second ends of respective windings 30U, 30V and 30W are mutually connected by the neutral point.

In the smoothing capacitor 10, a positive side bus bar 50p is connected to the positive terminal 10p of the smoothing capacitor 10, and a negative side bus bar 50n is connected to the negative terminal 10n of the smoothing capacitor 10. The bus bars 50p and 50n are conducting members having a long extended shape, specifically a conductive members having a long-extended plate shape. According to the first embodiment, each of the bus bars 50p and 50n has a linear section formed in a linear shape. In the linear section, cross-sections of the bus bars 50p and 50n are appropriately the same.

In the order of proximity from the positive side terminal 10p, the collector of the U-phase first upper arm switching element SUHA, the drain of the U-phase second upper arm switching element SUHB, the collector of the V-phase first upper arm switching element SVHA, the drain of the V-phase second upper arm switching element SVHB, the collector of the W-phase first upper arm switching element SWHA, and the drain of the W-phase second upper arm switching element SWHB are connected to the positive side bus bar 50p. According to the first embodiment, collectors and drains are connected to the linear section of the positive side bus bar 50p.

In the order of proximity from the negative side terminal 10n, the emitter of the U-phase first lower arm switching element SULA, the source of the U-phase second lower arm switching element SULB, the emitter of the V-phase first lower arm switching element SVLA, the source of the V-phase second lower arm switching element SVLB, the emitter of the W-phase first lower arm switching element SWLA, and the source of the W-phase second lower arm switching element SWLB are connected in parallel to the negative side bus bar 50n. Especially, according to the first embodiment, emitters and sources are connected to the linear section of the negative side bus bar.

The control unit 40 drives the inverter 20 in order to control a controlled variable of the motor generator to be a command value. The controlled variable is, for example, a torque. The control unit 40 outputs drive signals to the drive circuits (not shown) of the respective switches, so as to drive switching elements SUHA, SUHB, SULB, SVHA, SVHB, SVLA, SVLB, SWHA, SWHB, SWLA and SWLB to be ON or OFF. The control unit 40 performs a PWM process based on a comparison between the three-phase command voltages, where respective phases are shifted by 120° of electrical angle, and the carrier signal such as a triangle wave, thereby generating the drive signal corresponding to respective drive circuits. The drive signal includes an ON command that changes the state of the switching element to be ON, and an OFF command that changes the state of the switching element to be OFF. The upper arm drive signal and the lower arm drive signal are complementary signals. Hence, the upper arm switching element and corresponding lower arm switching element are alternately turned ON. According to the first embodiment, in the switches 20UH to 20WL, the first switching element and the second switching element are simultaneously turned ON or OFF.

Subsequently, characteristic configuration of the first embodiment will be described.

According to the above-described embodiment, In the order of proximity from the positive side terminal 10p, the collector of the U-phase first upper arm switching element SUHA, the drain of the U-phase second upper arm switching element SUHB, the collector of the V-phase first upper arm switching element SVHA, the drain of the V-phase second upper arm switching element SVHB, the collector of the W-phase first upper arm switching element SWHA, and the drain of the W-phase second upper arm switching element SWHB are connected to the positive side bus bar 50p.

Thus, in the respective upper arm switches 20UH, 20VH and 20WH, an inductance of a conduction path from the connection point of the first switching element (IGBT) at the positive side bus bar 50p to the positive side terminal 10p is smaller than an inductance of a conduction path from the connection point of second switching element (MOSFET) at the positive side bus bar 50p to the positive side terminal 10p.

Figure 3:
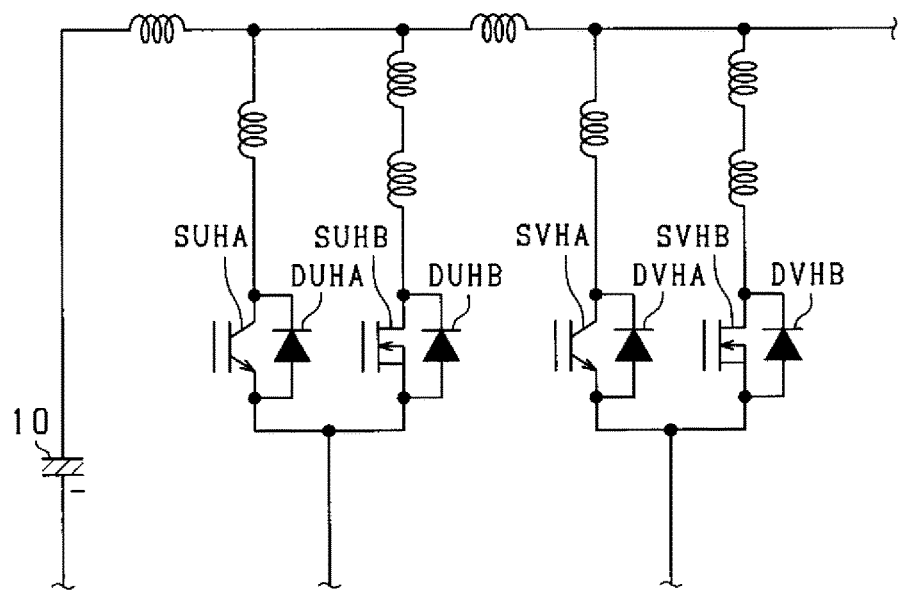
FIG. 3 is a diagram showing a change in inductance depending on a conducting path between a capacitor and an IGBT or a MOSFET.

FIG. 3 illustrates an example of a change in inductance for the U-phase upper arm switch 20UH and the V-phase upper arm switch 20VH.

According to the above-described configuration, in the large current region, surge voltage caused by switching ON to OFF of the first switching element reduced so that the switching loss occurring at the first switching element can be reduced. Hereinafter, an example of the U-phase upper arm switch 20UH shown in FIG. 3 will be described.

In the large current region, the larger the current supplied to the U-phase upper arm switch 20UH from the smoothing capacitor via the positive side bus bar 50p, the larger the collector current flowing through the U-phase first upper arm switching element SUHA. Here, the larger the collector current flowing through the U-phase first upper arm switching element SUHA, the larger the surge voltage caused by turning OFF of the U-phase first upper arm switching element. Accordingly, in the large current region, a surge voltage caused by switching off of the U-phase first upper arm switching element SUHA becomes larger than that of the U-phase second upper arm switching element SUHB.

Here, the smaller the inductance of the electrical conduction path, on the positive side bus bar 50$p$, from the smoothing capacitor 10 to the switching elements, the larger an effect of reduction in the surge voltage due to switching off operation. Hence, the inductance of the electrical conduction path between the collector of the U-phase first upper switching element SUHA and the positive side terminal 10$p$ via the positive side bus bar 50$p$, where a large amount of current flows, is set to be smaller than the inductance of the electrical conduction path between the drain of the U-phase second upper arm switching element SUHB and the positive side terminal 10$p$ via the positive side bus bar 50$p$. Thus, an effect of reduction in the surge voltage caused by switching off of the U-phase first upper arm switching element SUHA can be larger, and the switching loss caused by switching off of the U-phase first upper arm switching element SUHA can be reduced. Thus, power loss of the inverter 20 can be reduced. Also, switching loss due to switching-off operations can be reduced for the lower arm switches 20UL, 20VL and 20WL.

According to the first embodiment, in the large current region, the surge voltages at the upper arm switches 20UH, 20VH and 20WH due to switching-off operations can be reduced. Hereinafter, an example of the U-phase upper arm switch 20UH will be described.

When the U-phase first upper arm switching element SUHA turns ON from the OFF state, a recovery current flows through the free-wheel diode DULA connected to the U-phase first lower arm switching element SULA, in the reverse direction. Due to the recovery current, surge voltage occurs at the free-wheel diode DULA and the U-phase first lower arm switching element SULA. According to a configuration in which an inductance of a conduction path from the connection point of the first switching element (IGBT) at the positive side bus bar 50$p$ to the positive side terminal 10$p$ is smaller than an inductance of a conduction path from the connection point of the second switching element (MOSFET) at the positive side bus bar 50$p$ to the positive side terminal 10$p$, the surge voltage due to the recovery current can be reduced. As a result, switching loss due to switching-on operations can be reduced so that the power loss of the inverter 20 can be reduced. It should be noted that the switching loss caused by the switching-on operation can be reduced for each of the lower arm switches 20UL, 20VL and 20WL.

Further, according to the first embodiment, among U, V and W phases, adjacent phases at the connection points onto the positive side bus bar 50$p$ are designed such that IGBT switches where a large amount of current flows in the large current region are not adjacent to each other. In other words, IGBT switches and MOSFET switches are alternately placed to be connected to the positive side bus bar 50$p$. This configuration reduces the surge voltage. Hereinafter, as shown in FIG. 3, the U-phase upper arm switch 20UH and V-phase upper arm switch 20VH will be described as examples.

The surge voltage due to switching of the driving state of the V-phase first upper arm switching element SVHA in the V-phase upper arm switch 20VH is transmitted to the U-phase upper arm switch 20UH. Therefore, surge voltage transmitted from the V-phase arm switch 20VH may be superposed on the surge voltage due to switching operations of the U-phase first upper arm switching element SUHA. In this case, switching loss will be increased.

According to the first embodiment, on the positive side bus bar 50$p$, the connection point of the U-phase second upper arm switching element SUHB is disposed between the connection point of the U-phase first upper arm switching element SUHA and the connection point of the V-phase first upper arm switching element SVHA. Hence, on the positive side bus bar 50$p$, the connection point of the V-phase first upper arm switching element SVHA and the U-phase first upper arm switching element SUHA are not adjacent to each other. As a result, the electrical conduction path can be longer between the collector of the V-phase first upper arm switching element SVHA and the collector of the first upper arm switching element SUHA via the positive side bus bar 50$p$, so that the inductance value of the electrical conduction path can be increased. Hence, an attenuation effect on surge voltage at the V-phase upper arm switching element SVHA can be enhanced on the above-described electrical conduction path. Therefore, the surge voltage transmitted from the V-phase upper arm switching element SVHA can be prevented from being superposed on the surge voltage due to switching operation of the U-phase first upper arm switching elements SUHA.

(Second Embodiment)

Figure 4:
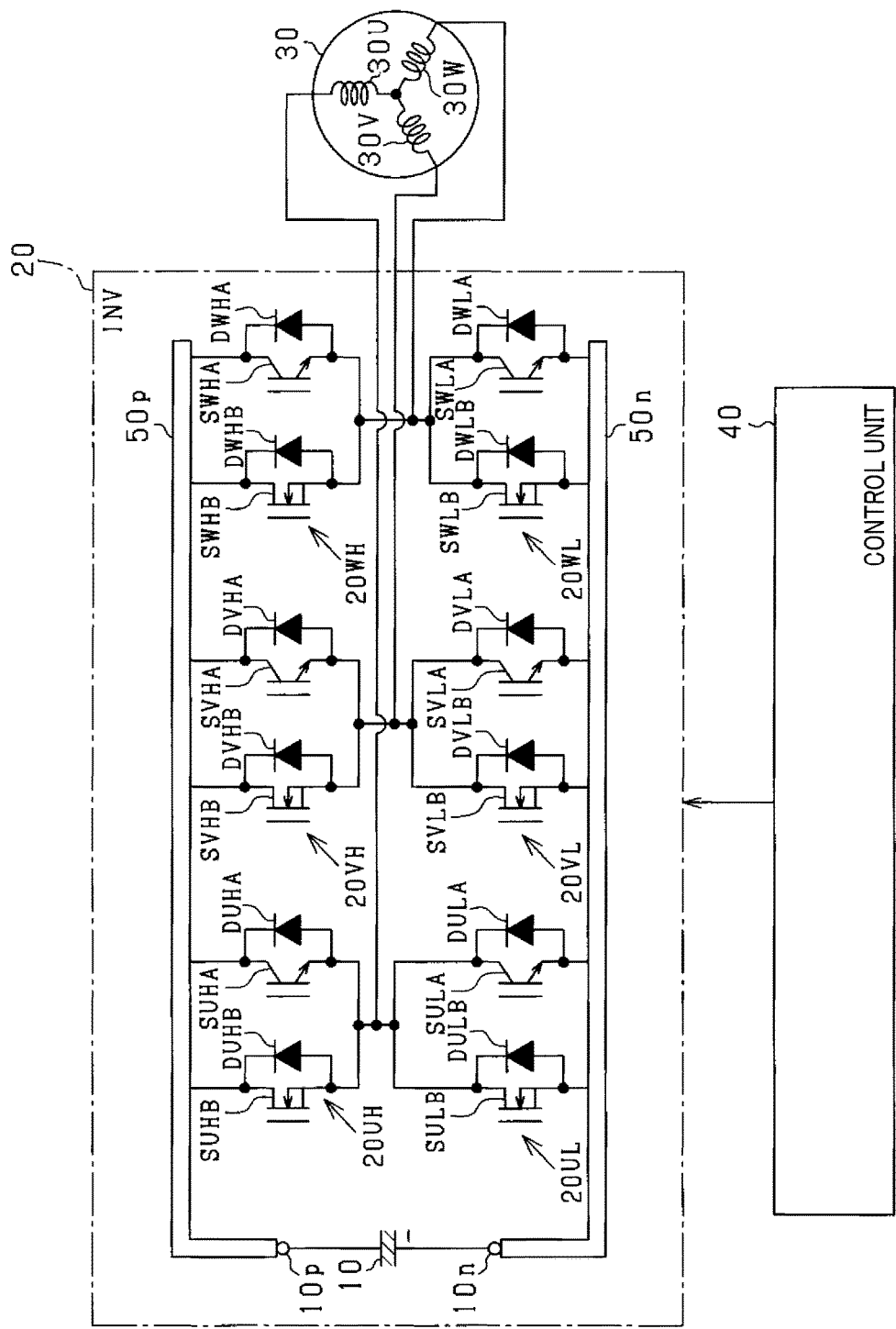
FIG. 4 is an overall configuration of an on-vehicle motor control system according to a second embodiment.

Hereinafter, with reference to the drawings, differences from the above-described first embodiment will mainly be described. According to the second embodiment, in the respective switches 20UH to 20WL, connection points of the first switching element and the second switching element on the respective bus bars 50$p$ and 50$n$ are changed. In FIG. 4, for convenience reasons, the same reference symbols are added to the same configuration as that shown in FIG. 1.

As shown in FIG. 4, in the order of proximity from the positive side terminal 10$p$, the drain of the U-phase second upper arm switching element SUHB, the collector of the U-phase first upper arm switching element SUHA, the drain of the V-phase second upper arm switching element SVHB, the collector of the V-phase first upper arm switching element SVHA, the drain of the W-phase second upper arm switching element SWHB, and the collector of the W-phase first upper arm switching element SWHA are connected to the positive side bus bar 50$p$. According to the second embodiment, collectors and drains are connected to the linear section of the positive side bus bar 50$p$.

In the order of proximity from the negative side terminal 10$n$, the source of the U-phase second lower arm switching element SULB, the emitter of the U-phase first lower arm switching element SULA, the source of the V-phase second lower arm switching element SVLB, the emitter of the V-phase first lower arm switching element SVLA, the source of the W-phase second lower arm switching element SWLB and the emitter of the W-phase first lower arm switching element SWLA are connected in parallel to the negative side bus bar 50$n$. Especially, according to the second embodiment, emitters and sources are connected to the linear section of the negative side bus bar.

Figure 5:
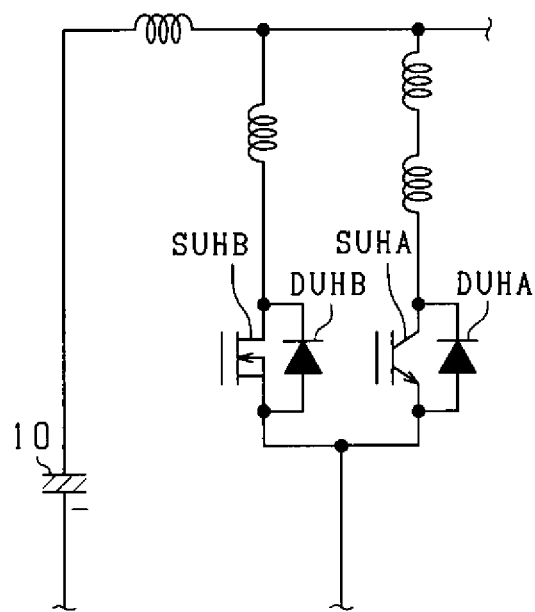
FIG. 5 is a diagram showing a change in inductance depending on a conducting path between a capacitor and an IGBT or a MOSFET.

Thus, in the respective upper arm switches 20UH, 20VH and 20WH, an inductance of a conduction path from the connection point of the second switching element (MOSFET) at the positive side bus bar 50$p$ to the positive side terminal 10$p$ is smaller than an inductance of a conduction path from the connection point of the first switching element (IGBT) at the positive side bus bar 50$p$ to the positive side terminal 10$p$. FIG. 5 illustrates an example of a change in inductance for the U-phase upper arm switch 20UH and the V-phase upper arm switch 20VH.

According to the above-described configuration, the power loss of the inverter 20 in a small current region can be reduced. Hereinafter, an example of the U-phase upper arm switch 20UH shown in FIG. 5 will be described.

In the small current region, the larger the current supplied to the U-phase upper arm switch 20UH from the smoothing capacitor 10 via the positive side bus bar 50p, the larger the current flowing through the U-phase second upper arm switching element SUHB. Further, the larger the drain current flowing through the U-phase second upper arm switching element SUHB, the larger the surge voltage due to the switching-off operation of the U-phase second upper arm switching element SUHB. Accordingly, in the small current region, the surge voltage due to the switching-off operation in the U-phase second upper arm switching element SUHB becomes larger than that of the U-phase first upper arm switching SUHA.

According to the second embodiment, the inductance of the electrical conduction path from the drain of the U-phase second upper arm switching element SUHB at which large amount of current flows in the small current region, to the positive side terminal 10p via the positive side bus bar 50p is set to be smaller than the inductance of the electrical conduction path from the collector of the U-phase first upper arm switching element SUHA to the positive side terminal 10p via the positive side bus bar. Thus, an effect of reduction in the surge voltage caused by switching off of the U-phase first upper arm switching element SUHA can be larger. Also, by setting the above-described inductances, the current going to flow through the U-phase first upper arm switching element SUHA can preferentially flow through the U-phase upper arm switching element SUHB. Therefore, since the current flows through the MOSFET rather than the IGBT in the small current region, power loss can be significantly reduced. Therefore, the power loss of the inverter 20 can be reduced.

According to the second embodiment, similarly to the first embodiment, the surge voltage can be reduced, the surge voltage being produced when the second switching elements of the upper arm switches 20UH to 20WH switch the state from off to on in the small current region.

According to the second embodiment, according to the first embodiment, similarly to the first embodiment, among U, V and W phases, adjacent phases at the connection points onto the positive side bus bar 50p are designed such that surge voltage transmitted from other phases can be reduced.

(Third Embodiment)

Figure 6:
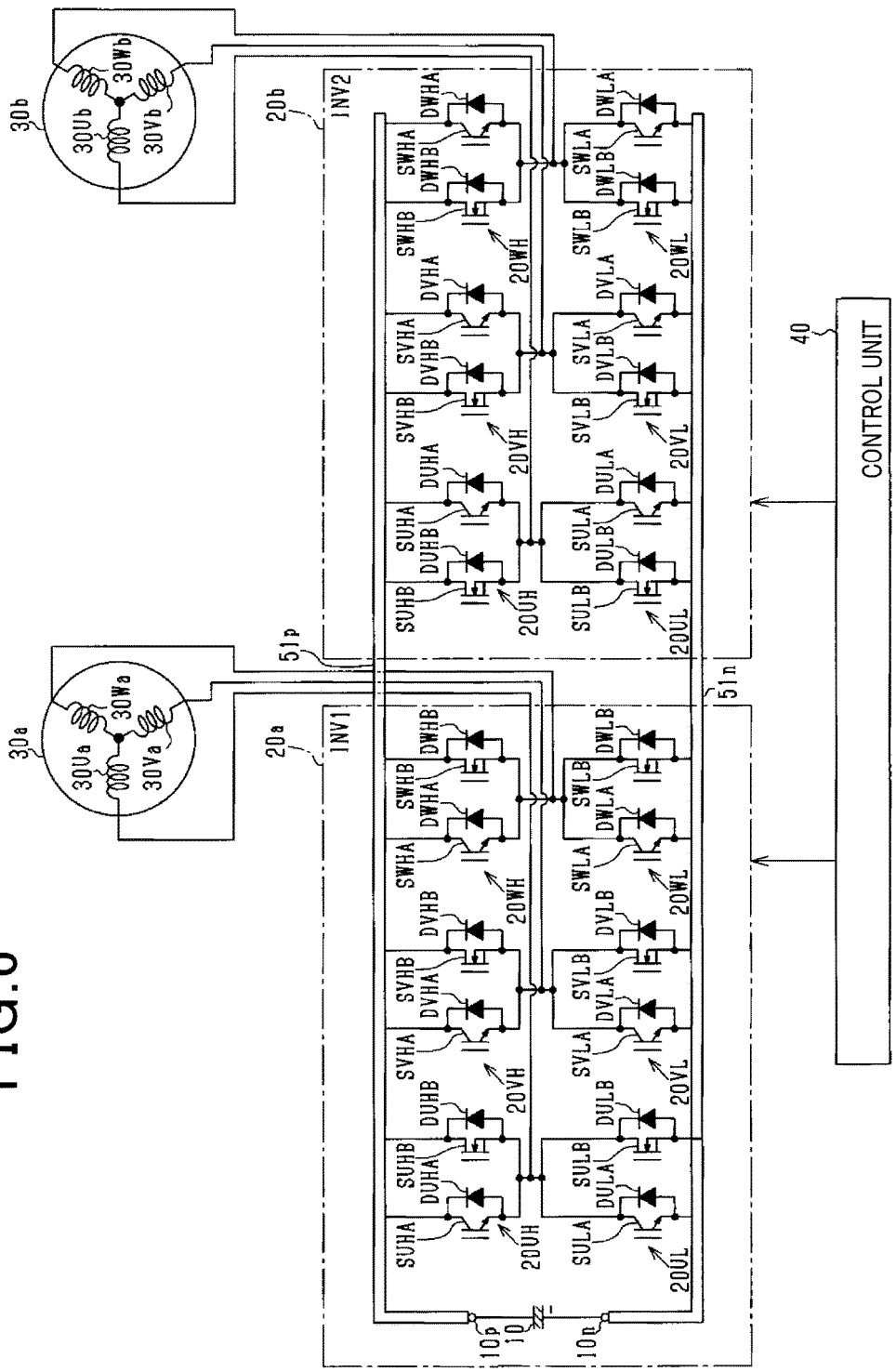
FIG. 6 is a diagram showing an overall configuration of an on-vehicle motor control system according to a third embodiment.

Hereinafter, with reference to the drawings, differences from the above-described first and second embodiments will mainly be described. According to the third embodiment, as shown in FIG. 6, as a control system, two pairs of motor generator and inverter are provided in the motor systems. In FIG. 6, for reasons of convenience, the same reference symbols are added to the same configuration as that shown in FIG. 1.

As shown in FIG. 6, the control system is provided with a first inverter 20a, a first motor generator 30a, a second inverter 20b, and a second motor generator 30b. According to the third embodiment, as the motor generators 30a and 30b, the same permanent magnet synchronous motor as the motor generator 30 of the first embodiment is used.

The first motor generator 30a serves as an on-vehicle main equipment similar to the motor generator 30 of the first embodiment. In FIG. 6, windings included in the first motor generator 30a are shown as windings 30Ua, 30Va and 30Wa.

The second motor generator 30b serves as a generator and a starter that applies initial rotation to the output shaft of the engine as an on-vehicle main equipment. In FIG. 6, windings included in the second motor generator 30b are shown as windings 30Ub, 30Vb and 30Wb.

According to the third embodiment, the first inverter 20a is configured similar to the inverter 20 of the first embodiment shown in FIG. 1. Hence, according to the third embodiment, the same symbols as the switching elements of the inverter 20 shown in FIG. 1 are applied to the switching elements of the first inverter 20a. The second inverter 20b has similar configuration to the inverter 20 of the second embodiment shown in FIG. 4. Hence, according to the third embodiment, the same symbols as used in the switching elements included in the inverter 20 shown in FIG. 4 are applied to the switching elements included in the second inverter 20b.

A positive side bus bar 51p is connected to the positive side terminal 10p of the smoothing capacitor 10. A negative side bus bar 51n is connected to the negative terminal 10n of the smoothing capacitor 10. The bus bars 50p and 50n are conducting member having a long extended shape, specifically a conductive member having a long-extended plate shape. According to the third embodiment, each of the bus bars 51p and 51n has a linear section formed in linear shape. In the linear section, cross-sections of the bus bars 51p and 51n are appropriately the same.

In the order of proximity from the positive side terminal 10p, input terminals of the upper arm switching elements included in the first inverter 20a are connected to the positive side bus bar 51p. Specifically, in the order of proximity from the positive side terminal 10p, the collector of the U-phase first upper arm switching element SUHA, the drain of the U-phase second upper arm switching element SUHB, the collector of the V-phase first upper arm switching element SVHA, the drain of the V-phase second upper arm switching element SVHB, the collector of the W-phase first upper arm switching element SWHA and the drain of the W-phase second upper arm switching element SWHB are connected to the positive side bus bar 51p.

In addition to the upper arm switching elements included in the first inverter 20a, input terminals of the upper arm switching elements included in the second inverter 20b are connected to the positive side bus bar 51p. Specifically, in the order of proximity from the drain side of the W-phase second upper arm switching element SWHB, the drain of the U-phase second upper arm switching element SUHB, the collector of the U-phase first upper arm switching element SUHA, the drain of the V-phase second upper arm switching element SVHB, the collector of the V-phase first upper arm switching element SVHA, the drain of the W-phase second upper arm switching element SWHB, the collector of the W-phase first upper arm switching element SWHA are connected to the positive side bus bar 51p. According to the third embodiment, each collector and the drain are connected to the linear section of the positive side bus bar 51p.

In the order of proximity from the negative side terminal 10n, input terminals of the lower arm switching elements included in the first inverter 20a are connected to the negative side bus bar 51n. Specifically, in the order of proximity from the negative side terminal 10n, the emitter of the U-phase first lower arm switching element SULA, the source of the U-phase second lower arm switching element SULB, the emitter of the V-phase first lower arm switching element SVLA, the source of the V-phase second lower arm switching element SVLB, the emitter of the W-phase first lower arm switching element SWLA and the source of the W-phase second lower arm switching element SWLB are connected to the positive side bus bar 50n.

In addition to the lower arm switching elements included in the first inverter 20a, output terminals of the lower arm switching elements included in the second inverter 20b are connected to the negative side bus bar 51n. Specifically, in the order of proximity from the source side of the W-phase second lower arm switching element SWLB, the source of the U-phase second lower arm switching element SULB, the emitter of the U-phase first lower arm switching element SULA, the source of the V-phase second lower arm switching element SVLB, the emitter of the V-phase first lower arm switching element SVLA, the source of the W-phase second lower arm switching element SWLB, and the emitter of the W-phase first lower arm switching element SWLA are connected to the negative side bus bar 51n. According to the third embodiment, each emitter and the source are connected to the linear section of the positive side bus bar 51p.

According to the third embodiment described above, in the positive side bus bar 51p, the connection points corresponding to the W-phase second upper arm switching element SWHB included in the first inverter 20a, and the U-phase second upper arm switching element SUHB included in the second inverter 20b are disposed between the connection point of the W-phase first upper arm switching element SWHA included in the first inverter 20a and the connection point of the U-phase first upper arm switching element SUHA included in the second inverter 20b. Hence, a distance between the first upper arm switching elements included in the first inverter 20a and the first upper arm switching elements included in the second inverter 20b through the positive side bus bar 51b can be longer, so that inductance can be increased. Thus, for example, surge voltage produced when switching the U-phase first upper arm switching element SUHA included in the second inverter 20b can be effectively attenuated in the transmission path of the bus bar 51p when the surge voltage is transmitted to the W-phase first upper arm switching element SWHA included in the first inverter 20a. As a result, surge voltage transmitted between the first inverter 20a and the second inverter 20b can be reduced.

According to the third embodiment, in the first inverter 20a and the second inverter 20b, switching elements included in either the first inverter 20a or the second inverter 20b correspond to object switching elements and the switching elements included in the other inverter correspond auxiliary switching elements.

(Other Embodiment)

The above-described embodiments may be modified as follows.

According to the first and second embodiments, by changing the distances from the positive terminal 10p of the smoothing capacitor 10 to the connection points of the input terminals of the upper arm switching elements, the inductance value is changed. However, it is not limited thereto. For example, the width of the bus bar may be changed so as to change the inductance. Here, the wider the bus bar, the lower the inductance value. The inductance of the negative bus bar side 50n is similar to that of the positive side bus bar 50p.

According to the above-described first embodiment, the switching part is configured of two switching elements having minimum on-resistance in the respective two current regions. However, it is not limited thereto. For example, three or more switching elements may be used in which switching elements have minimum on-resistance in the respective current regions. When using three switching elements having minimum on-resistance in three current regions such as small, intermediate, large regions, to configure a switching part, the connection point of the input terminal of the switching element corresponding to the large current region may be disposed, in the positive side bus bar, between the connection point of the input terminal corresponding to the small current region and the connection point of the input terminal corresponding to the intermediate current region.

In the third embodiment, a system provided with three or more sets of motor generator and inverter may be used. For example, in the case where three sets of motor generator and inverter are used in a system, among three inverters connected via the positive side bus bar 51p, adjacent two inverters correspond to an inverter provided with an object switching elements, and an inverter provided with other switching elements.

As a switching element which configures each of the switch parts, the switching element is not limited to a combination of the IGBT and MOSFET, but a combination of other devices may be used.

As the positive and negative bus bars, it is not limited to a bus bar having a linear section. For example, a bus bar having a part of curved long-extended plate shape may be used. The positive side and the negative side bus bars are not limited to having a plate shape, but a rod like shape may be used.

Inverters are not limited to three-phase inverters. However, inverters having one phase, two phases or four or more phases may be used. As an electronic circuit configured of a plurality of switching elements connected in parallel to each other, it is not limited to inverters.

As a power source connected to the bus bar, not only the smoothing capacitors but also secondary batteries may be used.

The motor generator is not limited to a permanent-magnet type synchronous motor, but a field-winding synchronous motor may be used. Further, as a motor generator, it is not limited to the synchronous motor, but an induction motor may be used. Also, the motor generator is not limited to on-vehicle main equipment. However, the motor generator may be used for other purposes such as motors used for an electric power steering system or an air-conditioning compressor.

What is claimed is:

1. An electronic circuit comprising:
   a bus bar connected to a power source having a positive terminal and a negative terminal; and
   a plurality of object switching elements as driving objects connected to the bus bar, wherein
   the object switching elements include: (i) a first type of object switching elements, which are minimum on-resistance elements, and (ii) a second type of object switching elements, the first type of object switching elements having an on-resistance that is less than the on-resistance of the second type of object switching elements in a corresponding current region among mutually different current regions, and
   each first type of object switching element forms a parallel connected circuit with a respective second type of object switching element; and
   connection points between the minimum on-resistance elements and the bus bar are located at different locations to have mutually different inductances of respective conduction paths between the power source to the connection points located at the different locations.

2. The electronic circuit according to claim 1, wherein the minimum on-resistance elements in the object switching elements, where an on-resistance becomes minimum in a predetermined current region, are located on the bus bar at a location having smaller inductance to the power source than that of other minimum on-resistance elements in the object switching elements, where an on-resistance becomes minimum in a current region smaller than the predetermined current region.

3. The electronic circuit according to claim 2, wherein the minimum on-resistance elements in the object switching elements, where an on-resistance becomes minimum in a predetermined current region, are located on the bus bar at a location closer to the power source than that of other minimum on-resistance elements in the object switching elements, where an on-resistance becomes minimum in a current region smaller than the predetermined current region.

4. The electronic circuit according to claim 3, wherein each of the object switching elements has a diode connected in parallel in a reverse direction;
the object switching elements are configured of a plurality of upper arm switching elements connected in parallel to each other, and a plurality of lower arm switching elements connected in parallel to each other and connected in series to the upper arm switching elements;
the upper arm switching elements and the lower arm switching elements are alternately turned ON;
the bus bar includes a positive side bus bar and a negative side bus bar, the positive side bus bar being connected to each of the upper arm switching elements at a terminal opposite to a terminal connected to the lower arm switching element, and the negative side bus bar being connected to each of the lower arm switching elements at a terminal opposite to a terminal connected to the upper arm switching element;
the power source is a capacitor of which the positive terminal is connected to the positive side bus bar and the negative terminal is connected to the negative side bus bar; and
the minimum on-resistance elements in the upper arm switching elements, where an on-resistance becomes minimum in the predetermined current region, are located on the bus bar at a location closer to the positive terminal of the capacitor than that of other minimum on-resistance elements in the upper arm switching elements, where an on-resistance becomes minimum in a current region smaller than the predetermined current region.

5. The electronic circuit according to claim 1, wherein the minimum on-resistance elements in the object switching elements, where an on-resistance becomes minimum in a predetermined current region, are located on the bus bar at a location having smaller inductance to the power source than that of other minimum on-resistance elements in the object switching elements, where an on-resistance becomes minimum in a current region larger than the predetermined current region.

6. The electronic circuit according to claim 5, wherein the minimum on-resistance elements in the object switching elements, where an on-resistance becomes minimum in the predetermined current region, are located on the bus bar at a location closer to the power source than that of other minimum on-resistance elements in the object switching elements, where an on-resistance becomes minimum in a current region larger than the predetermined current region.

7. The electronic circuit according to claim 6, wherein each of the object switching elements has a diode connected in parallel in a reverse direction;
the object switching elements are configured of a plurality of upper arm switching elements connected in parallel to each other, and a plurality of lower arm switching elements connected in parallel to each other and connected in series to the upper arm switching elements;
the upper arm switching elements and the lower arm switching elements are alternately turned ON;
the bus bar includes a positive side bus bar and a negative side bus bar, the positive side bus bar being connected to each of the upper arm switching elements at a terminal opposite to a terminal connected to the lower arm switching element, the negative side bus bar being connected to each of the lower arm switching elements at a terminal opposite to a terminal connected to the upper arm switching element;
the power source is a capacitor of which the positive terminal is connected to the positive side bus bar and the negative terminal is connected to the negative side bus bar; and
the minimum on-resistance elements in the upper arm switching elements, where an on-resistance becomes minimum in the predetermined current region, are located on the bus bar at a location closer to the positive terminal of the capacitor than that of other minimum on-resistance elements in the upper arm switching elements, where an on-resistance becomes minimum in a current region larger than the predetermined current region.

8. The electronic circuit according to claim 3,
the object switching elements form a plurality of parallel connected circuits; and
among adjacent parallel connected circuits at connection points on the bus bar in the plurality of parallel connected circuits, connection points of minimum on resistance elements to the bus bar, where an on-resistance of the minimum on resistance elements becomes minimum in the largest current region, are not located to be adjacent to each other.

9. The electronic circuit according to claim 1, wherein the electronic circuit includes a plurality of auxiliary switching elements connected to the bus bar, and the auxiliary switching elements are connected in parallel to each other;
the plurality of auxiliary switching elements include auxiliary minimum on-resistance elements having minimum on-resistance compared to other object switching elements in a corresponding current region among mutually different current regions;
the object switching elements connected to the bus bar at the furthest locations from the power source are the minimum on-resistance elements having the smallest current region in the plurality of object switching elements; and
the auxiliary minimum on-resistance elements having the smallest current region in the plurality of auxiliary switching elements are connected to a location adjacent to a connection point of the minimum on-resistance elements located at a far side from the power source.

* * * * *